(12) United States Patent
Kim

(10) Patent No.: US 6,482,695 B1
(45) Date of Patent: Nov. 19, 2002

(54) METHOD FOR FABRICATING SEMICONDUCTOR DEVICE INCLUDING STACKED CAPACITORS

(75) Inventor: Jae Kap Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 37 days.

(21) Appl. No.: 09/676,441

(22) Filed: Sep. 29, 2000

(30) Foreign Application Priority Data

Sep. 29, 1999 (KR) .......................................... 99-41670

(51) Int. Cl.[7] .......................................... H01L 21/8242
(52) U.S. Cl. ...................................... 438/253; 438/396
(58) Field of Search ................................ 438/253–256, 438/396–399, 238, 381

(56) References Cited

U.S. PATENT DOCUMENTS

| | | | |
|---|---|---|---|
| 5,818,079 A | | 10/1998 | Noma et al. |
| 5,847,412 A | | 12/1998 | Kakumu et al. |
| 5,851,869 A | | 12/1998 | Urayama |
| 6,040,614 A | | 3/2000 | Kitaguchi et al. |
| 6,069,038 A | * | 5/2000 | Hashimoto et al. ......... 438/235 |
| 6,107,190 A | | 8/2000 | Taguwa et al. |
| 6,107,200 A | | 8/2000 | Takagi et al. |
| 6,117,725 A | * | 9/2000 | Huang ......................... 438/241 |
| 6,165,833 A | * | 12/2000 | Parekh et al. ............... 438/240 |

* cited by examiner

Primary Examiner—Jey Tsai
(74) Attorney, Agent, or Firm—Timothy J. Keefer; Wildman, Harrold, Allen & Dixon

(57) ABSTRACT

Disclosed is a method for fabricating a semiconductor device including stacked capacitors on a semiconductor substrate having a logic circuit region formed with a circuit and a RAM cell region formed with a plurality of transistors, involving the steps of forming an insulating film to a thickness corresponding to a height of stacked capacitors, to be formed, over an upper surface of the semiconductor substrate, partially removing the insulating film from the RAM cell region, thereby forming a space in which the stacked capacitors are to be formed, forming the stacked capacitors in the space, and partially removing the insulating film from the logic circuit region, and forming interconnection lines for the logic circuit in a space defined in the logic circuit region by virtue of the removal of the insulating film. In accordance with this method, steps formed during the formation of capacitors are removed prior to subsequent processing steps for forming layers over those capacitors. Accordingly, it is possible to accurately pattern the layers formed after the formation of the capacitors. It is also possible to achieve a desired fineness of interconnection lines.

12 Claims, 17 Drawing Sheets

METHOD FOR FABRICATING SEMICONDUCTOR DEVICE INCLUDING STACKED CAPACITORS

CROSS REFERENCE TO RELATED APPLICATION

This application claims the priority of the Korean patent application Ser. No: 99-41670 entitled "METHOD FOR FABRICATING SEMICONDUCTOR DEVICE INCLUDING STACKED CAPACITORS" filed on Sep. 29, 1999.

BACKGROUND OF THE INVENTION

1. Field of the Invention

The present invention relates to a method for fabricating a semiconductor device including stacked capacitors, and more particularly to a method for fabricating a semiconductor device including stacked capacitors, which is capable of effectively reducing a topology resulting from those stacked capacitors.

2. Description of the Related Art

As well known, the recent trend to fabricate a semiconductor device with a high degree of integration inevitably results in a reduced cell size. Such a semiconductor device has a stacked capacitor structure having an increased stack height in order to obtain a desired capacity in the reduced cell size. Due to such an increased stack height, there is a severe topology between a RAM cell region formed with capacitors and a logic circuit region around the RAM cell region, as shown in FIG. 1. In FIG. 1, the reference character "A" denotes the logic circuit region, and the reference character "B" denotes the RAM cell region.

In the logic circuit region A arranged around capacitors, the semiconductor device has a reduced line width and a narrow line space due to a high degree of integration thereof.

Such a semiconductor device also has a multi-layered line structure in order to obtain an increased integration efficiency. Due to such a multi-layered line structure, the number of interconnection lines adapted to electrically connect lines of multi-layers together must be increased.

For the high degree of integration in such a semiconductor device, accordingly, it is required to form a pattern having an increased accuracy in the logic circuit region A. Furthermore, it is difficult to conduct a patterning process for layers formed following the formation of capacitors because the topology caused by the structure of those capacitors becomes severe.

That is, a severe topology is generated between the RAM cell region B formed with capacitors and the logic circuit region A formed with a logic circuit due to an increased stack height of the capacitor structure. Due to such a severe topology, it is impossible to form an accurate pattern in the logic circuit region A or RAM cell region B. This is because when a particular layer formed on the capacitor structure is patterned in accordance with a photolithography process, there is a focus depth difference between exposure light onto the logic circuit region A and exposure light onto the RAM cell region B.

SUMMARY OF THE INVENTION

The present invention has been made in view of the above mentioned problems, and an object of the invention is to provide a method for fabricating a semiconductor device including stacked capacitors, which is capable of effectively reducing a topology formed between a logic circuit region and a RAM cell region.

In accordance with the present invention, this object is accomplished by providing A method for fabricating a semiconductor device including stacked capacitors on a semiconductor substrate having a logic circuit region formed with a circuit and a RAM cell region formed with a plurality of transistors, comprising the steps of: forming an insulating film to a thickness corresponding to a height of stacked capacitors, to be formed, over an upper surface of the semiconductor substrate; partially removing the insulating film from the RAM cell region, thereby forming a space in which the stacked capacitors are to be formed; forming the stacked capacitors in the space; and partially removing the insulating film from the logic circuit region, and forming interconnection lines for the logic circuit in a space defined in the logic circuit region by virtue of the removal of the insulating film.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Figure 1:
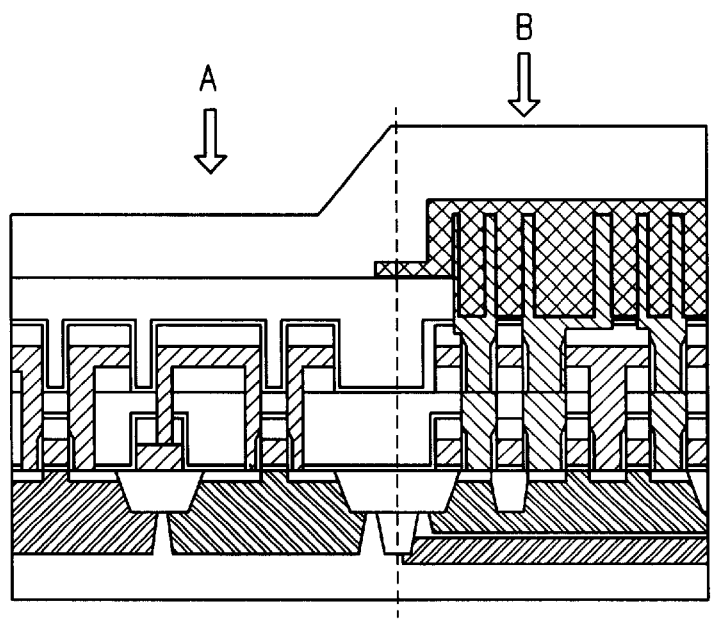
FIG. 1 is a cross-sectional view illustrating a semiconductor device including stacked capacitors fabricated in accordance with a conventional method.

Now, preferred embodiments of the present invention will be described in detail, in conjunction with the annexed drawings.

The important technical idea of the present invention is to avoid a severe topology from forming between a RAM cell region and a logic circuit region around the RAM cell region due to an increased stack height of stacked capacitors, thereby not only achieving an easy formation of patterns for layers to be formed following the formation of those capacitors in a RAM cell region, but also achieving an easy formation of interconnection lines in a logic circuit region. This technical idea is realized by maintaining an interlayer insulating film formed on the logic circuit region during the formation of capacitors in the RAM cell region, thereby reducing the topology formed between those regions. It should be understood that this technical idea is applied to the following embodiments of the present invention.

For an easy and best understanding of the present invention, layers having the same function are denoted by the same reference numeral. For the forming and patterning processes for each layer, those typically used in the manufacture of semiconductor devices. Accordingly, no description will be made in conjunction with those processes.

[Embodiment 1]

FIGS. 2a to 2i are cross-sectional views respectively illustrating sequential processing steps of a method for fabricating a semiconductor device including stacked capacitors in accordance with a first embodiment of the present invention.

Figure 2A:
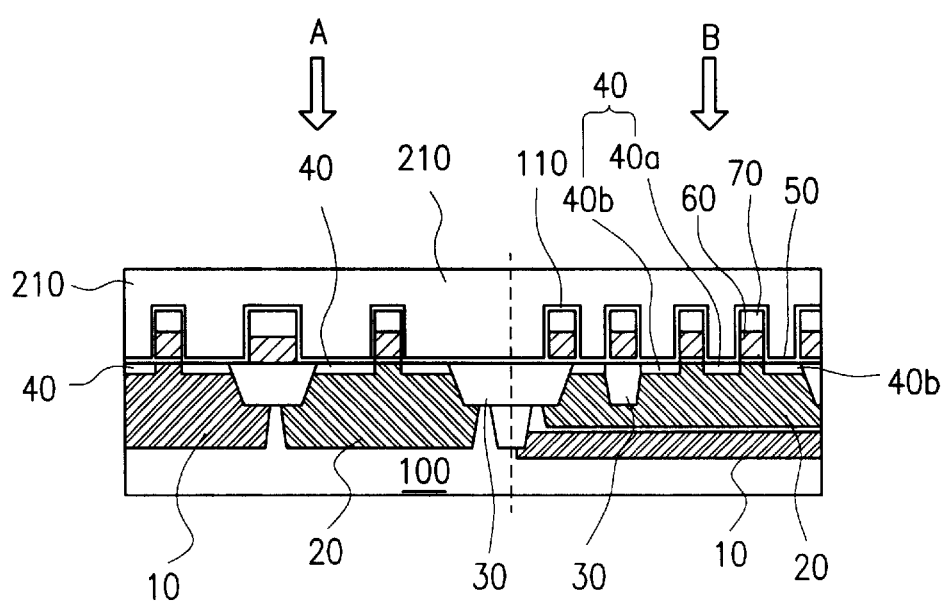
FIGS. 2a to 2i are cross-sectional views respectively illustrating sequential processing steps of a method for fabricating a semiconductor device including stacked capacitors in accordance with a first embodiment of the present invention.

In accordance with this embodiment of the present invention, a semiconductor substrate 100 is first prepared, which is formed with a desired logic circuit in a logic circuit region A, and a plurality of transistors, respectively adapted to drive capacitors to be subsequently formed, in a RAM cell region B, as shown in FIG. 2a. Although not shown, the semiconductor substrate 100 is in a state formed with an intermediate insulating film covering both the logic circuit region A and the RAM cell region B. A nitride or other material is then laminated over the entire upper surface of the semiconductor substrate 100, thereby forming an etch barrier film 110. An oxide is subsequently formed over the first etch barrier film 110. The oxide film is then planarized to form a first interlayer insulating film 210.

Figure 2B:
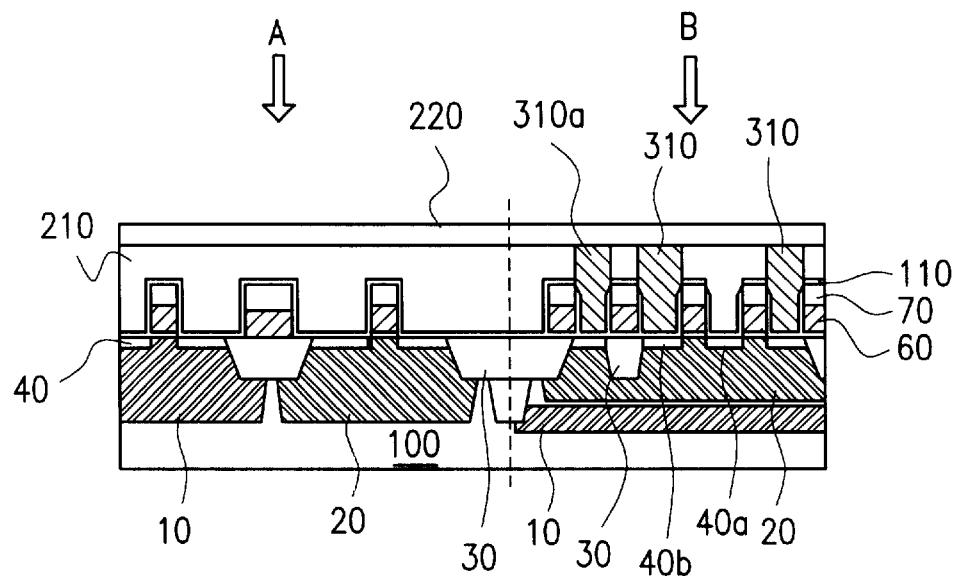

Referring to FIG. 2b, the first interlayer insulating film 210 and first etch barrier film 110 are then partially removed from the RAM cell region B, thereby forming first contact holes through which drain electrodes 40b formed in the RAM cell region B are exposed, respectively. Thereafter, a conductive material such as polysilicon is completely filled in the first contact holes. The conductive material remaining on the first interlayer insulating film 210 is then removed using an etchback process. Thus, contact plugs 310 and 310a are formed.

The contact plugs 310a, which are arranged at the outermost portion of the RAM cell region B adjacent to the logic circuit region A, are dummy plugs. These contact plugs 310a will be electrically connected to dummy charge storage electrodes in a subsequent processing step, respectively.

Source electrodes 40a formed in the RAM cell region B may also be exposed when the drain electrodes 40b are exposed, in order to form contact plugs on those source electrodes 40a. In this case, bit line contacts may be subsequently formed on the contact plugs of the source electrodes 40a.

Subsequently, an oxide or other appropriate material is then laminated over the entire upper surface of the resulting structure formed with the contact plugs 310 and dummy plugs 310a, thereby forming a second interlayer insulating film 220.

Figure 2C:
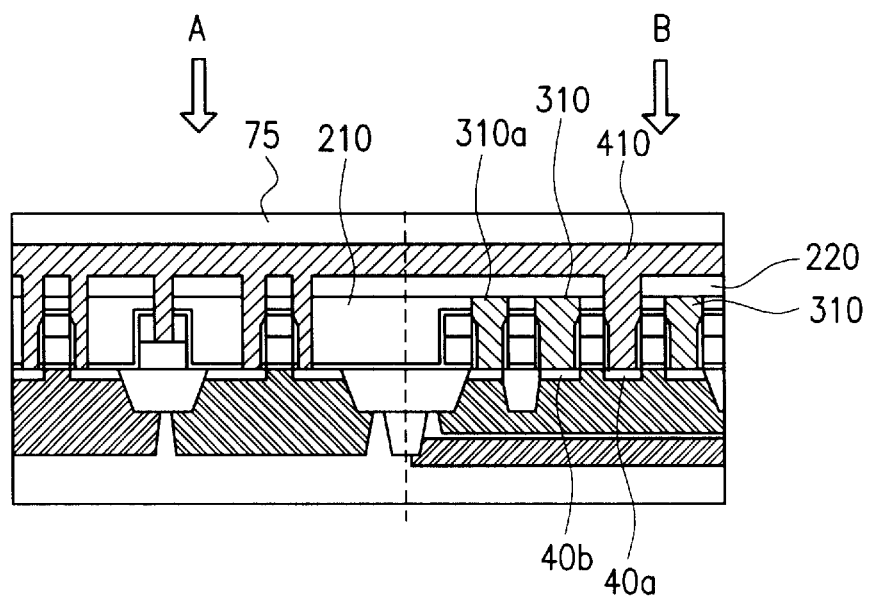

Referring to FIG. 2c, the second interlayer insulating film 220, first interlayer insulating film 210, and first etch barrier film 110 are partially removed in a sequential fashion, thereby forming second contact holes through which the source electrodes 40a, in the RAM cell region B, to be connected with bit lines in a subsequent processing step, active regions 40 defined in the logic circuit region A to be connected with first interconnection lines, and gate electrodes are exposed. In the case in which contact plugs are also formed on the source electrodes 40a at the processing step of FIG. 2b, the second contact holes associated with the bit lines are formed on those contact plugs.

Thereafter, a conductive material is formed over the resulting structure to form a first conductive layer 410 covering the upper surface of the second interlayer insulating film 220 while completely filling the second contact holes. An insulating material is then laminated over the first conductive layer 410, thereby forming a second intermediate insulating film 75. This first conductive layer 410 will be subsequently patterned so that it is used as first interconnection lines 410a in the logic circuit region A while being used as bit lines 410b in the RAM cell region B.

Figure 2D:
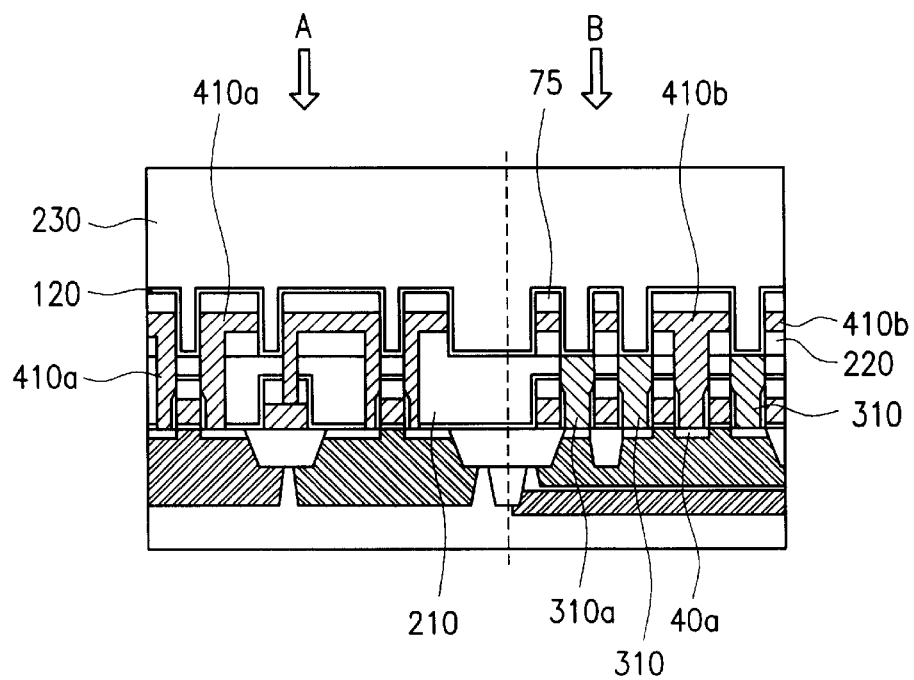

Referring to FIG. 2d, the second intermediate insulating film 75, first conductive layer 410, second interlayer insulating film 220 are then patterned to form the first interconnection lines 410a and bit lines 410b. In accordance with the pattering of the second intermediate insulating film 220 at this processing step, respective upper surfaces of the contact plugs 310 and dummy plugs 310a are exposed.

A nitride film is subsequently laminated over the entire upper surface of the resulting structure, in which the contact plugs 310 and dummy plugs 310a are exposed, thereby forming a second etch barrier film 120. An oxide film is then laminated over the second etch barrier film 120 to a thickness more than a desired height of capacitors to be subsequently formed. Then, the oxide film is planarized using a CMP process, thereby forming a third interlayer insulating film 230.

The third interlayer insulating film 230 is used as an interlayer insulating film in the logic circuit region A to reduce a topology defined between the logic circuit region A and stacked capacitors to be subsequently formed. In the RAM cell region B, the third interlayer insulating film 230 is subsequently removed in order to allow a formation of stacked capacitors on that region where the third interlayer insulating film 230 is removed.

Figure 2E:
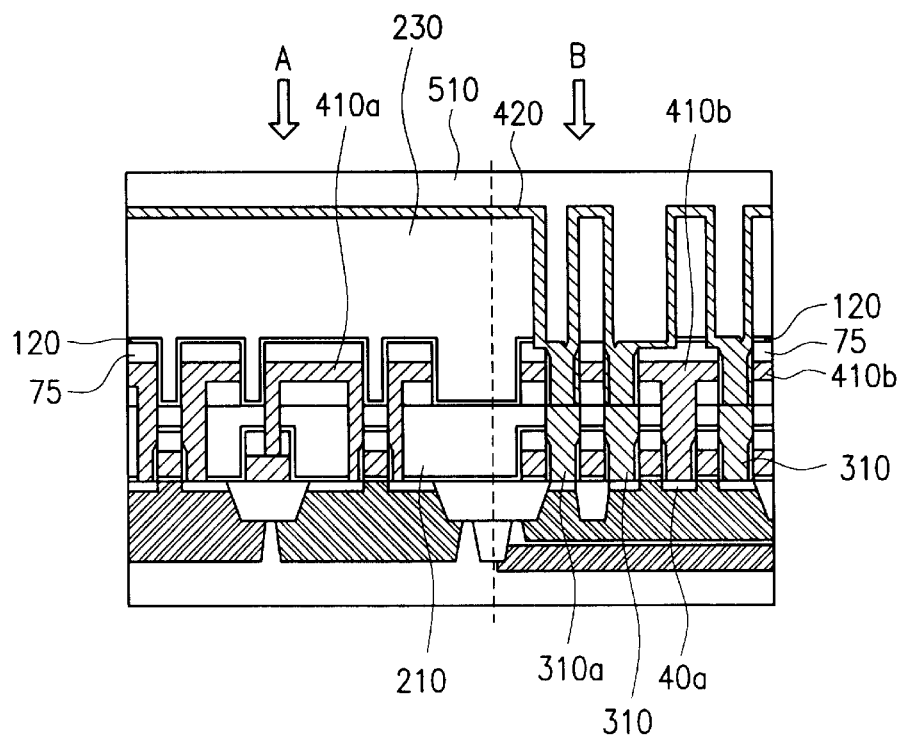

Referring to FIG. 2e, the third interlayer insulating film 230 and second etch barrier film 120 are then partially removed from the RAM cell region B, thereby forming third contact holes through which respective upper surfaces of the contact plugs 310 and dummy plugs 310a are exposed. A conductive material such as polysilicon is laminated over the entire upper surface of the resulting structure formed with the third contact holes, thereby forming a second conductive layer 420.

The second conductive layer 420 is used as charge storage electrodes of capacitors to be formed at a subsequent processing step. Practically, in order to provide a space, to be formed with a dielectric film and a plate electrode, for each cell, the second conductive layer 420 is formed on a surface exposed after removing the third interlayer insulating film 230 for an area larger than the formation area of each plug 310 or 301a, and then partially removing the second intermediate insulating film 75 and the second etch barrier film 120 formed on the second intermediate insulating film 75.

Thereafter, a sacrificial film 510 is formed by forming, over the second conductive layer 420, an oxide which can be easily etched. The formation of the sacrificial film 510 is achieved in such a fashion that the sacrificial film is sufficiently buried in spaces each defined between portions of the second conductive layer 420 respectively corresponding to adjacent cells. Where the sacrificial film 510 is made of the same material as the third interlayer insulating film 230, it is possible to easily remove both the sacrificial film 510 and the third interlayer insulating film 230 using the same etchant.

Figure 2F:
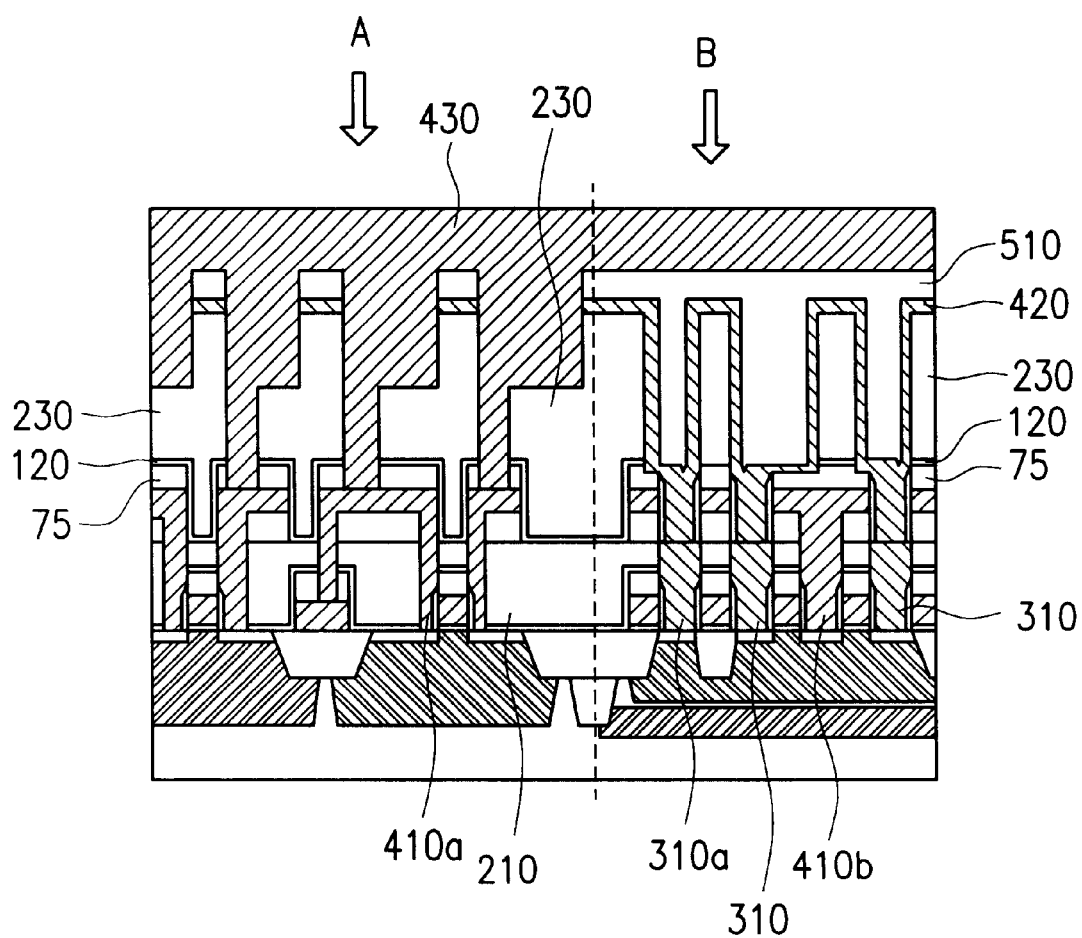

Referring to FIG. 2f, the sacrificial film 510, second conductive layer 420, third interlayer insulating film 230, second etch barrier film 120, and second intermediate insulating film 75 are partially removed from the logic circuit region A in a sequential fashion, thereby forming four contact holes though which respective upper surfaces of the first interconnection lines 410a to be electrically connected to second interconnection lines are exposed.

Subsequently, the sacrificial film 510, second conductive layer 420, and second interlayer insulating film 220 are partially removed to a desired depth using a photolithography process, thereby forming grooves for forming the second interconnection lines.

Thereafter, a third conductive layer 430 is formed by laminating a conductive material over the resulting structure obtained after the processing step of FIG. 2f. The third conductive layer 430 will be used to form the second interconnection lines at a subsequent processing step. To this end, the third conductive layer 430 should be sufficiently buried in the fourth contact holes and grooves. Alternatively, the formation order of the fourth contact holes and second interconnection line grooves may be reversed, as will be described in conjunction with a second embodiment of the present invention.

Figure 2G:
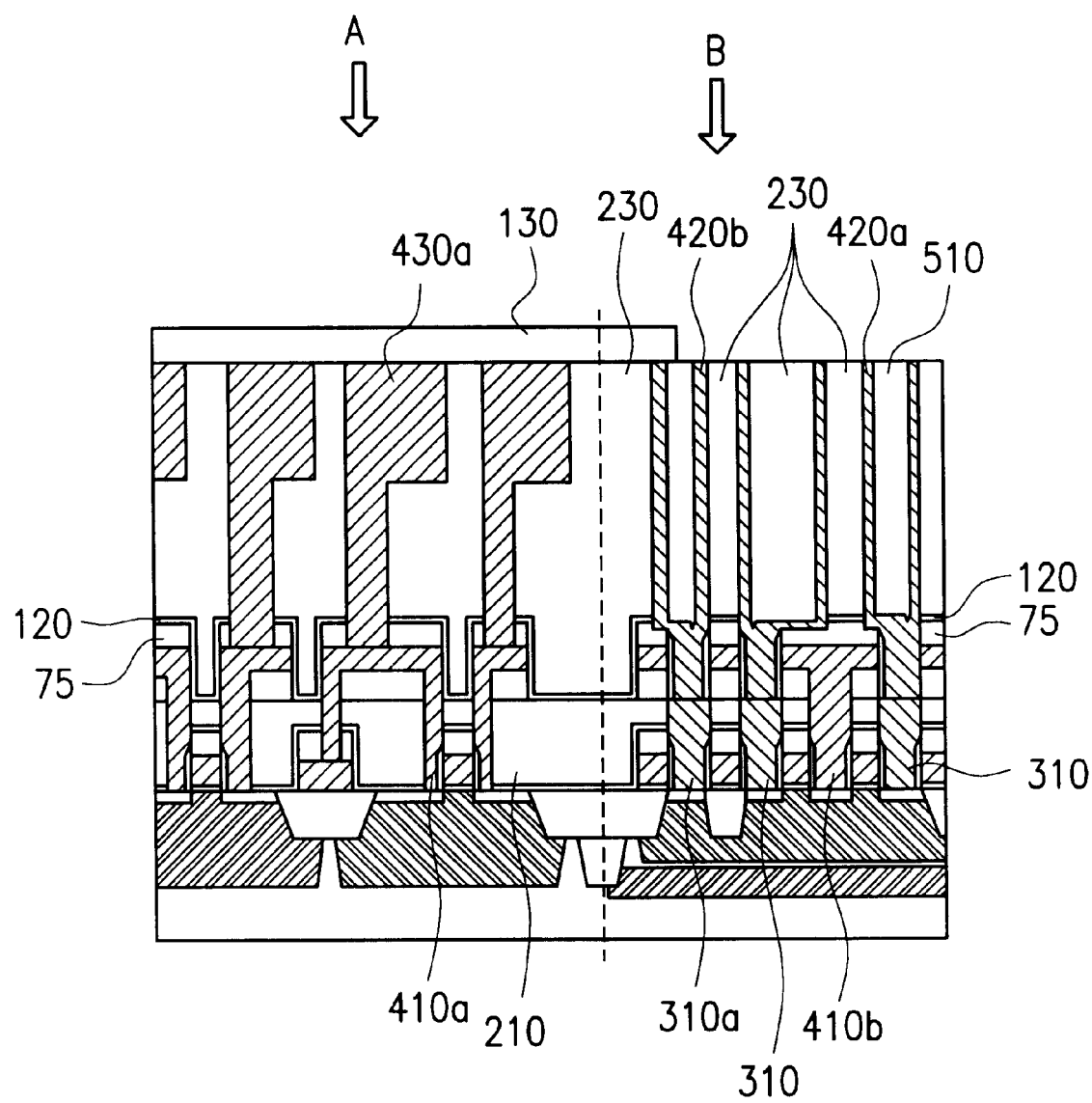

Referring to FIG. 2g, the third conductive layer 430, sacrificial film 510, and second conductive layer 420 are removed using an etchback process in such a fashion that the upper surface of the third interlayer insulating film 230 is exposed. By this etchback process, the second conductive layer 420 is formed into charge storage electrodes 420a and dummy electrodes 420b (that, is electrodes respectively connected to the dummy plugs), and the third conductive layer 430 is formed into the second interconnection lines denoted by the reference numeral 430a. The charge storage electrodes 420a and dummy electrodes 420b of adjacent cells are electrically insulated from each other by the third interlayer insulating film 230.

A nitride film is then laminated over the entire upper surface of the resulting structure obtained after the etchback process, thereby forming a third etch barrier film 130. The third etch barrier film 130 is patterned using a photolithography process in such a fashion that it is removed from the RAM cell region B.

The third etch barrier film 130 serves to prevent the logic circuit region A from being damaged during a removal of the sacrificial film 510 from the RAM cell region B. In this regard, it is desirable to overlap the third etch barrier film 130 with the dummy electrodes 420b arranged adjacent to the logic circuit region A.

Figure 2H:
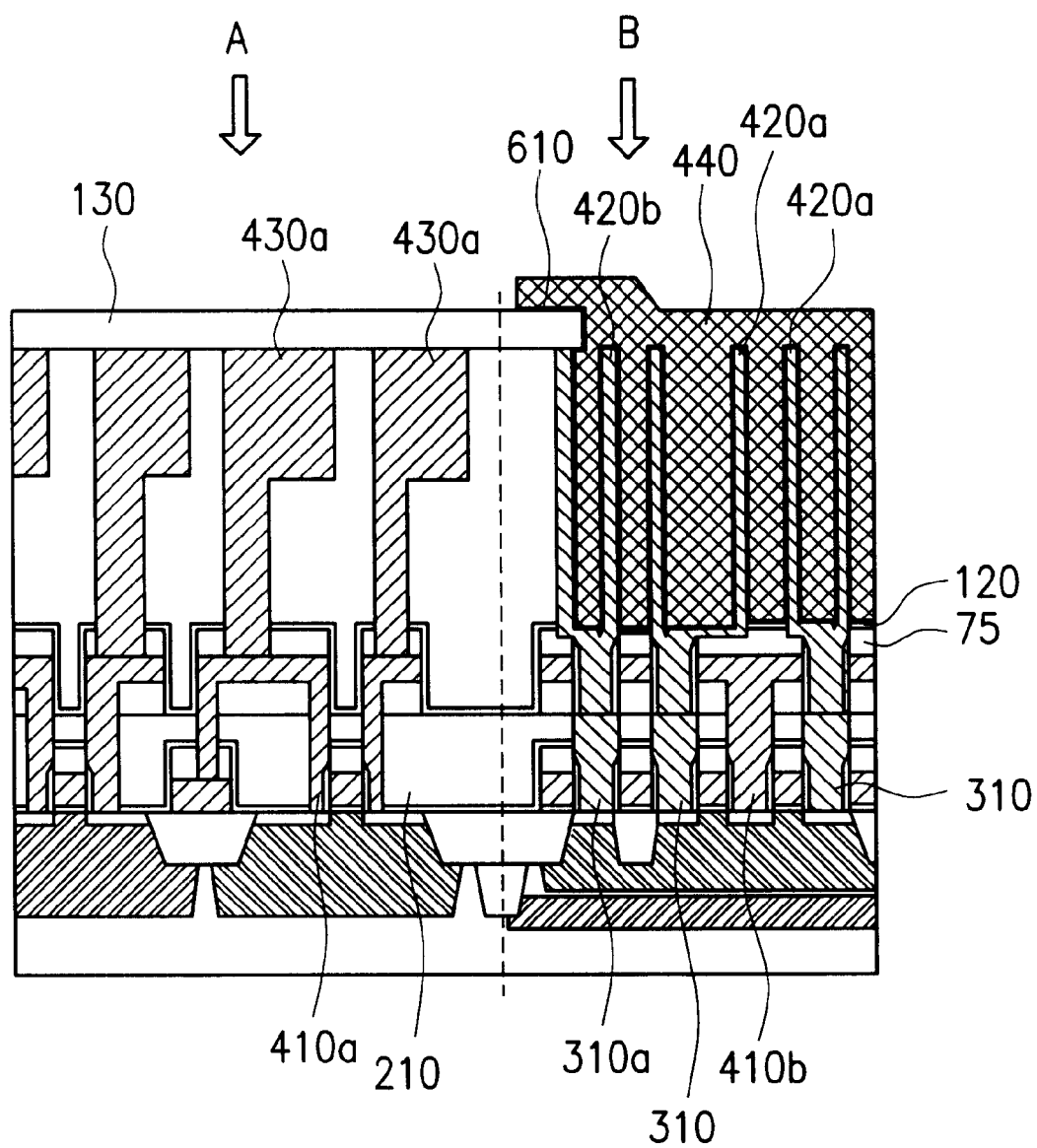

Referring to FIG. 2h, the sacrificial film 510 and third interlayer insulating film 230 exposed after the etchback process are then removed in accordance with a well-known dry or wet etch process. Where the sacrificial film 510 is made of the same material as the third interlayer insulating film 230, they may be simultaneously removed using the same etchant, as mentioned above.

Thereafter, a dielectric film 610 is formed by laminating a dielectric material over the entire upper surface of the resulting structure obtained after the processing step of FIG. 2h. A conductive material such as polysilicon is then formed over the dielectric film 610, thereby forming a fourth conductive layer 440. This fourth conductive layer 440 is then removed from the logic circuit region A, thereby forming a plate electrode 440a. Thus, stacked capacitors are obtained.

Preferably, the charge storage electrodes may be subjected to a surface treatment so that they have an hemispherical grain (HSG) structure at their surfaces, thereby achieving an increased capacitance of the capacitors.

Figure 2I:
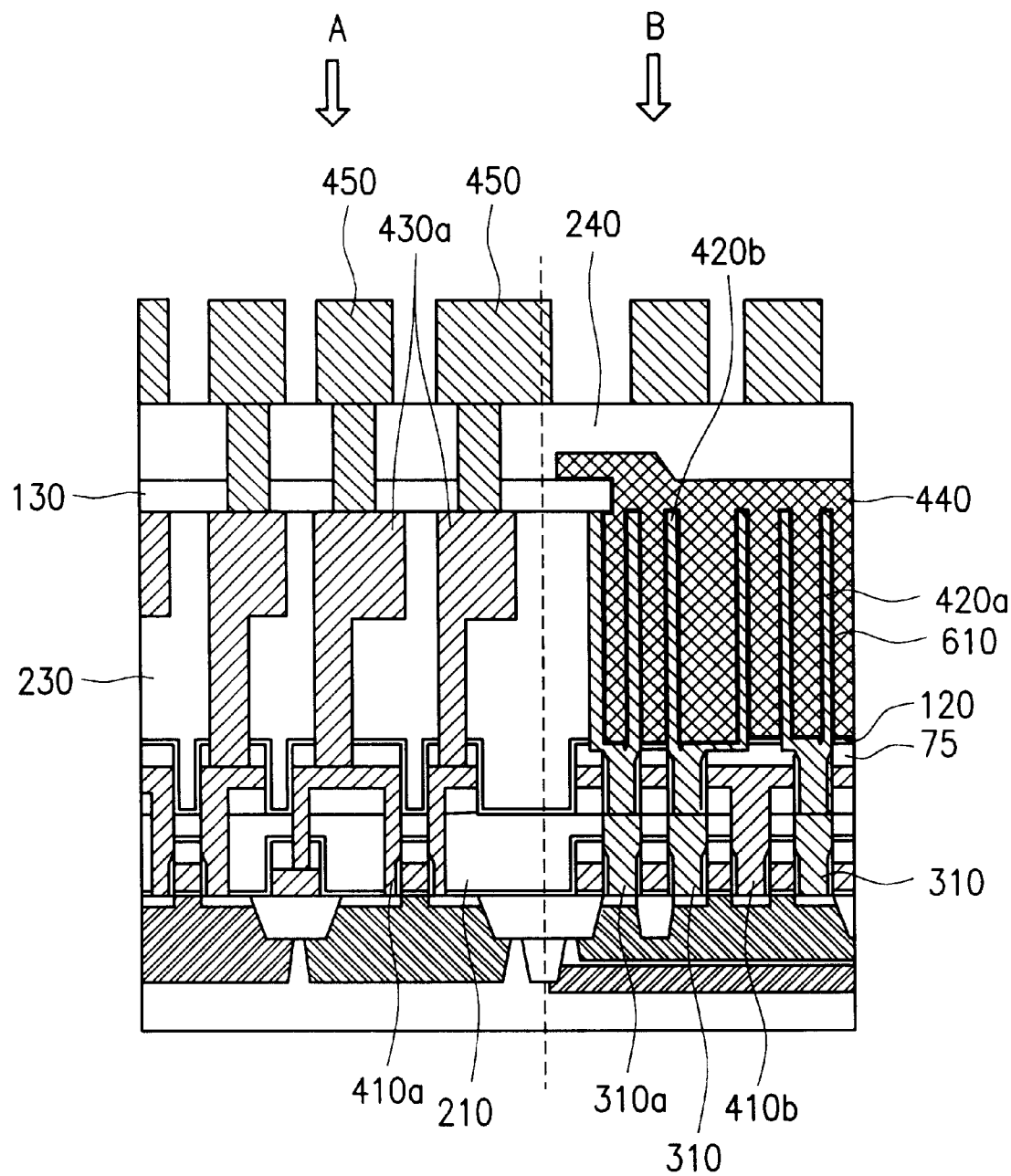

Referring to FIG. 2i, an oxide or other appropriate material is then laminated over the entire upper surface of the resulting structure obtained after the formation of the stacked capacitors, thereby forming a fourth interlayer insulating film 240. This fourth interlayer insulating film 240 is then partially removed from the logic circuit region A, along with the third etch barrier film 130, thereby forming fifth contact holes through which respective upper surfaces of the second interconnection lines 430a to be connected to third interconnection lines are exposed.

Thereafter, an oxide or other appropriate material is laminated over the entire upper surface of the resulting structure formed with the fifth contact holes, thereby forming a fifth conductive layer 450. This fifth conductive layer 450 is then patterned to form the three interconnection lines denoted by the reference numeral 450a. In accordance with this embodiment, at least one. additional insulating film and additional interconnection lines may be formed in so far as they are allowed in terms of topology.

[Embodiment 1-1]

This embodiment is an embodiment modified from the first embodiment of the present invention. This embodiment is the same as the first embodiment, except for the following :configuration. Accordingly, no description will be made for the same configuration of this embodiment as the first embodiment, for the simplicity of description.

Figure 3:
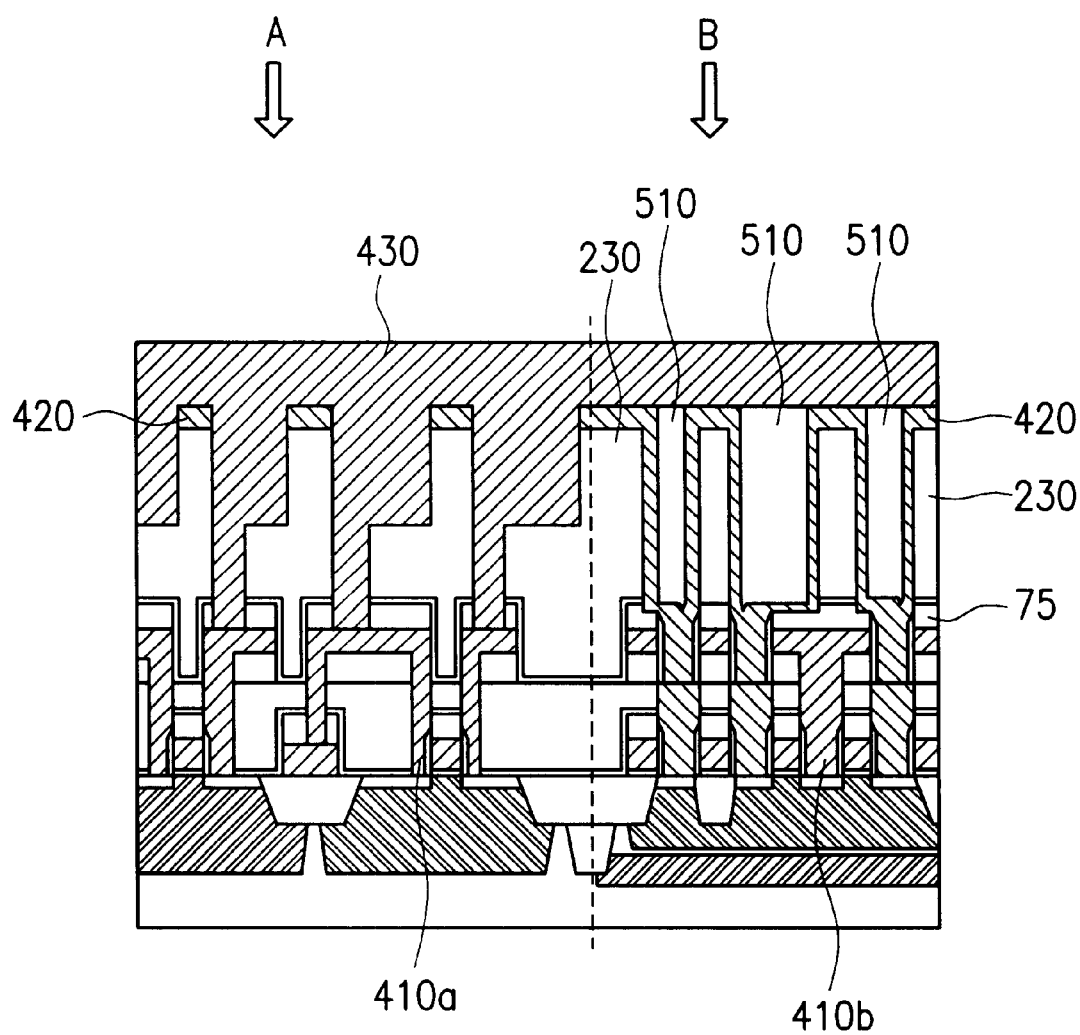
FIG. 3 is a cross-sectional view illustrating a method for fabricating a semiconductor device including stacked capacitors in accordance with a first modified embodiment from the first embodiment of the present invention.

FIG. 3 is a cross-sectional view illustrating a method for fabricating a semiconductor device including stacked capacitors in accordance with a first modified embodiment from the first embodiment of the present invention.

Referring to FIG. 3, the sacrificial film 510 formed at the processing step of FIG. 2e according to the first embodiment is partially removed using an etchback process in such a fashion that the upper surface of the second conductive layer 420 is exposed, in accordance with this method.

Thereafter, the second conductive layer 420, third interlayer insulating film 230, second etch barrier film 120, and second intermediate insulating film 75 are partially removed in a sequential fashion, thereby forming contact holes through which respective upper surfaces of the first interconnection lines 410a to be electrically connected to second interconnection lines are exposed, respectively.

The sacrificial film 510, second conductive layer 420, and third interlayer insulating film 230 are then partially removed to a desired depth using a photolithography process, thereby forming grooves adapted to form the second interconnection lines.

Subsequently, a conductive material is laminated over the entire upper surface of the resulting structure obtained after the formation of the grooves, thereby a third conductive layer 430. In this case, the third conductive layer 430 is in contact with the upper surface of the second conductive layer 420, as compared to the first embodiment in which the third conductive layer 430 is only in contact with the upper surface of the sacrificial film 510.

Thereafter, the third conductive layer 430 is removed using an etchback process in such a fashion that the upper surface of the third interlayer insulating film 230 is exposed, as in the first embodiment. The same subsequent processing steps as those of the first embodiment are then carried out.

In accordance with this first modified embodiment, one additional etchback step is carried out, as compared to the first embodiment. In this first modified embodiment, however, it is unnecessary to use the processing step for removing the sacrificial film 510 when the contact holes for exposing the upper surfaces of the first interconnection lines 410a and the grooves adapted to the second interconnection lines are formed. Since the formation of the contact holes and grooves is achieved using two processing steps, there is an effect that the removal of the sacrificial film 510 can be achieved by conducting the etchback process one time, as compared to the first embodiment in which the removal of the sacrificial film 510 is achieved by conducting the etchback process two times.

In the processing steps of forming the contact holes and grooves, and removing the layers arranged over the third insulating layer 230, it is necessary to change, two times, the etchant used, in the first embodiment. This is because the sacrificial film 510, the second conductive layer 420, and the third interlayer insulating film 230 are sequentially etched in this order. In accordance with this first modified embodiment, the above processing steps can be conducted without the change of the etchant because the third conductive layer 430 and second conductive layer 420 are in contact with each other. In particular, this effect is enhanced where the second and third conductive layers are made of the same conductive material.

[Embodiment 1-2]

This embodiment is another embodiment modified from the first embodiment of the present invention. This embodiment is the same as the first embodiment, except for the following configuration. Accordingly, no description will be made for the same configuration of this embodiment as the first embodiment, for the simplicity of description.

Figure 4:
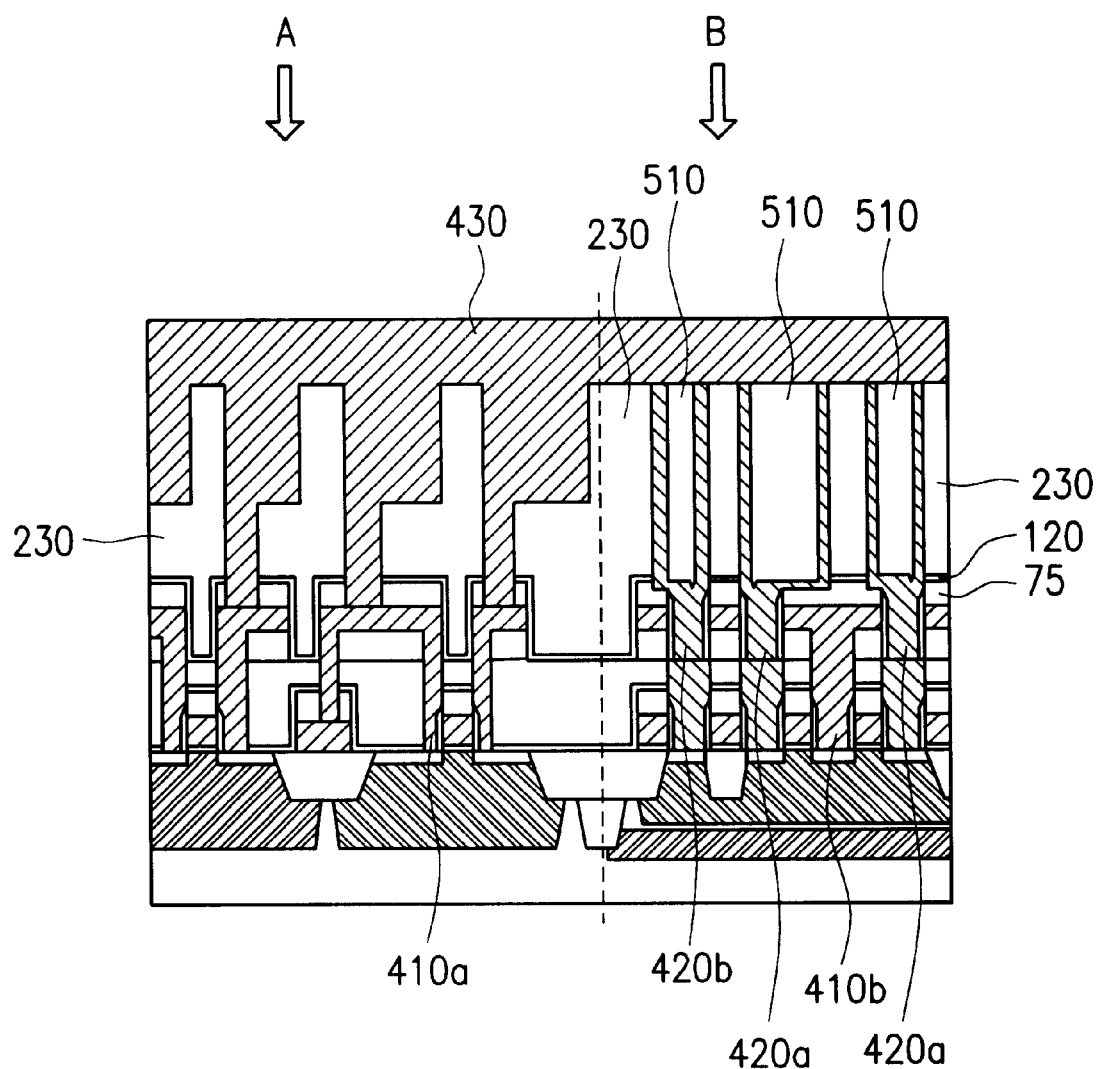
FIG. 4 is a cross-sectional view illustrating a method for fabricating a semiconductor device including stacked capacitors in accordance with a second modified embodiment from the first embodiment of the present invention.

FIG. 4 is a cross-sectional view illustrating a method for fabricating a semiconductor device including stacked capacitors in accordance with a second modified embodiment from the first embodiment of the present invention.

Referring to FIG. 4, the sacrificial film 510 formed at the processing step of FIG. 2e according to the first embodiment is partially removed, along with the second conductive layer 420, using an etchback process in such a fashion that the upper surface of the third interlayer insulating film 230 is exposed, in accordance with this method. Thus, the remaining second conductive layer 420 is formed into charge storage electrodes 420a.

Thereafter, the third interlayer insulating film 230, second etch barrier film 120, and second intermediate insulating film 75 are partially removed in a sequential fashion, thereby forming contact holes through which respective upper surfaces of the first interconnection lines 410a to be electrically connected to second interconnection lines are exposed, respectively.

The third interlayer insulating film 230 is then partially removed to a desired depth using a photolithography process, thereby forming grooves adapted to form the second interconnection lines. Subsequently, a conductive material is laminated over the entire upper surface of the resulting structure obtained after the formation of the grooves, thereby a third conductive layer 430.

Thereafter, the third conductive layer 430 is removed using an etchback process in such a fashion that the upper surface of the third interlayer insulating film 230 is exposed, as in the first embodiment. The same subsequent processing steps as those of the first embodiment are then carried out.

Similarly to the first modified embodiment, one additional etchback step is carried out in accordance with this second modified embodiment, as compared to the first embodiment.

In this modified embodiment, however, there is an advantage in that the formation of the contact holes and grooves can be easily and accurately achieved because the contact holes and grooves are formed by etching only the third interlayer insulating film 230.

[Embodiment 2]

FIGS. 5a to 5d are cross-sectional views respectively illustrating sequential processing steps of a method for fabricating a semiconductor device including stacked capacitors in accordance with a second embodiment of the present invention.

The formation of the third interlayer insulating film 230 in this embodiment is achieved using the same processing steps as those in the first embodiment of the present invention, that is, the processing steps of FIGS. 2a to 2d.

Figure 5A:
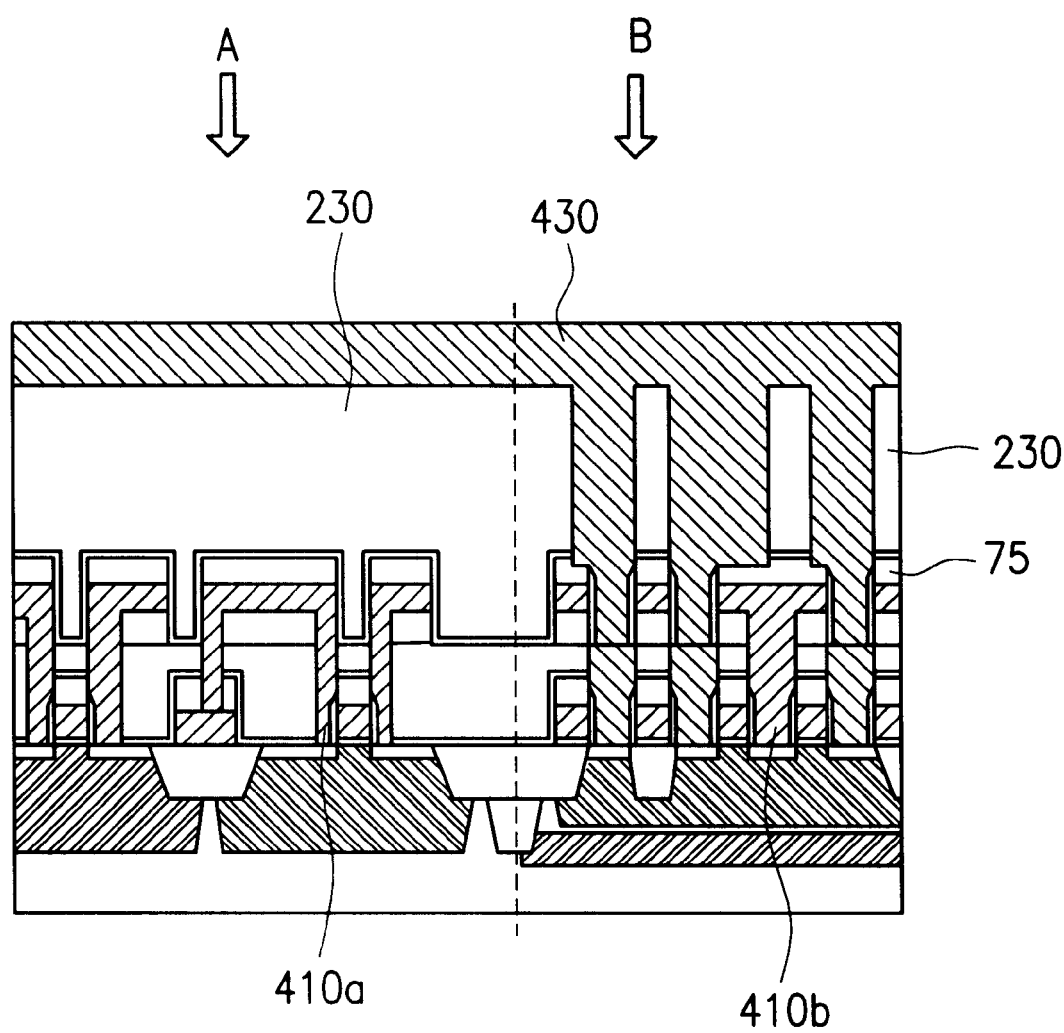
FIGS. 5a to 5d are cross-sectional views respectively illustrating sequential processing steps of a method for fabricating a semiconductor device including stacked capacitors in accordance with a second embodiment of the present invention.

Referring to FIG. 5a, the third interlayer insulating film 230 and second etch barrier film 120 are partially removed from the RAM cell region B after the processing step of FIG. 2d, thereby forming third contact holes through which respective upper surfaces of the contact plugs 310 and dummy plugs 310a are exposed. A conductive material such as polysilicon is laminated over the entire upper surface of the resulting structure formed with the third contact holes, thereby forming a second conductive layer 420 filling the third contact holes.

Figure 5B:
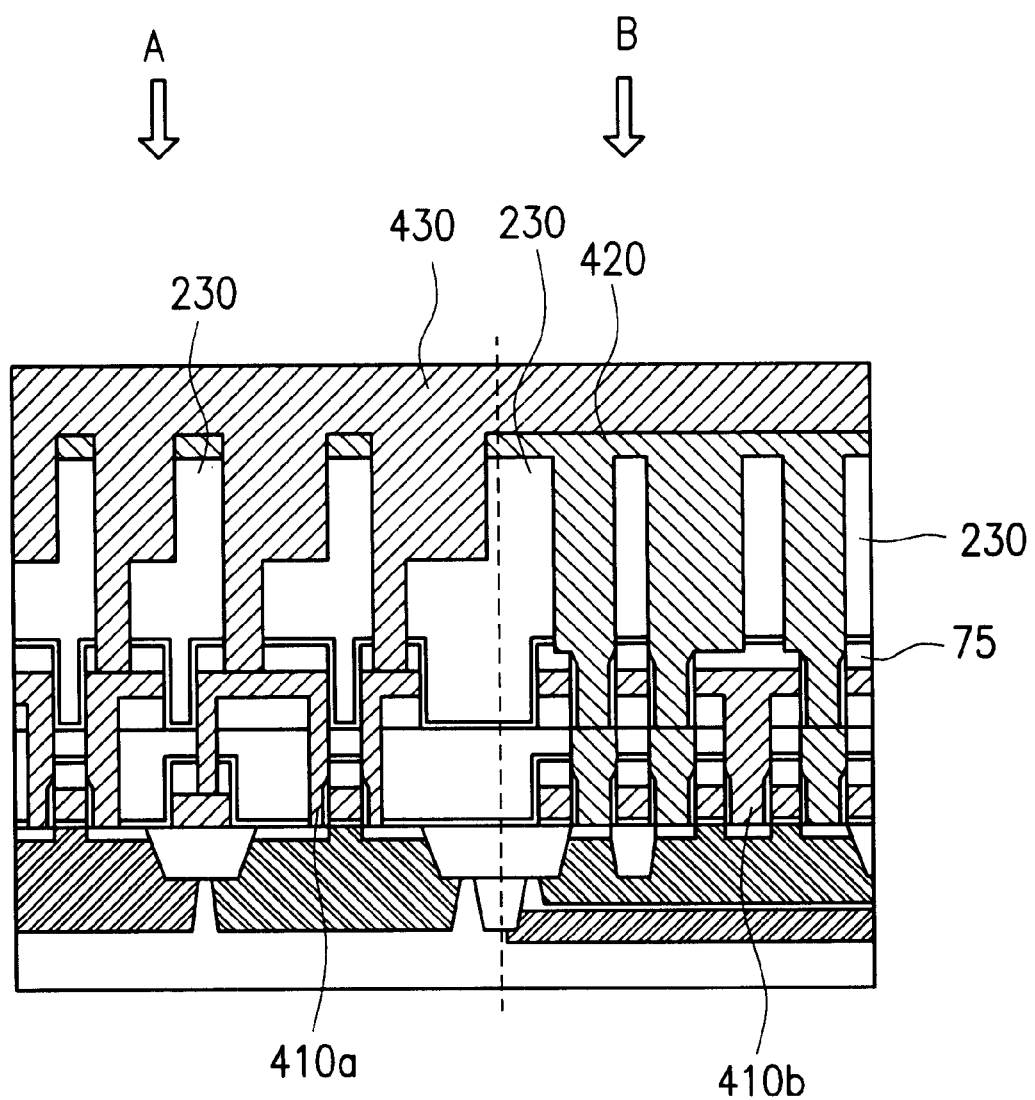

Referring to FIG. 5b, the second conductive layer 420, third interlayer insulating film 230, second etch barrier film 120, and second intermediate insulating film 75 are then partially removed from the logic circuit region A, thereby forming contact holes. Subsequently, grooves are formed by completely removing a portion of the second conductive layer 420 arranged at a region formed with the contact holes, and partially removing a portion of the third interlayer insulating film 230 arranged at the same region to a desired depth.

A conductive material such as polysilicon is then laminated over the entire upper surface of the resulting structure obtained after the formation of the grooves, thereby forming a third conductive layer 430 covering the entire upper surface of the second conductive layer 420 while filling the contact holes and grooves.

Figure 5C:
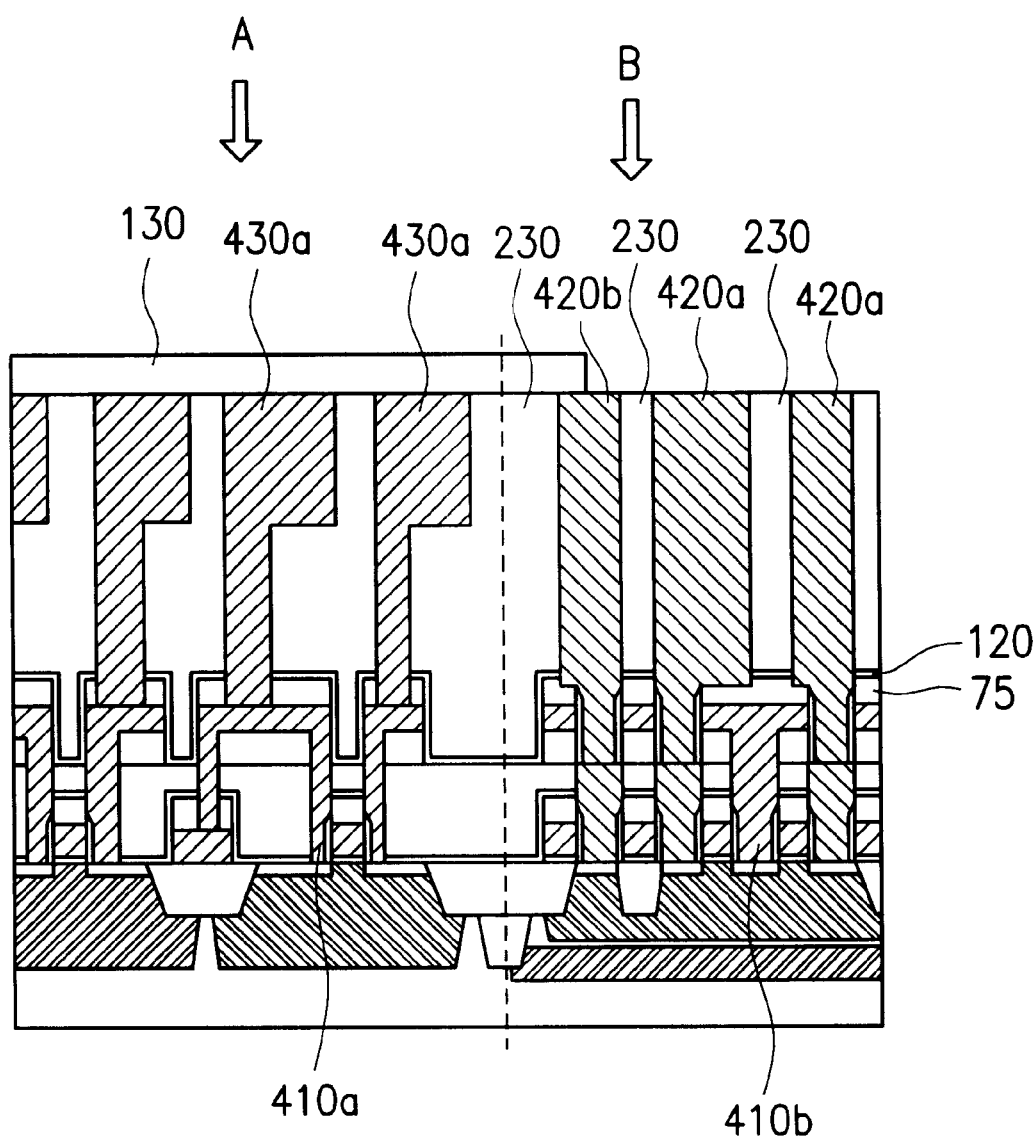

Referring to FIG. 5c, the third conductive layer 430 and second conductive layer 420 arranged over the third interlayer insulating film 230 are removed using an etchback process. By this etchback process, the third conductive layer 430 is formed into second interconnection lines 430a in the logic circuit region A. In the RAM cell region B, the second conductive layer 420 is formed into charge storage electrodes 420a and dummy electrodes 420b (that, is electrodes respectively connected to the dummy plugs). The charge storage electrodes 420a and dummy electrodes 420b of adjacent cells are electrically insulated from each other by the third interlayer insulating film 230.

A nitride film is then laminated over the entire upper surface of the resulting structure obtained after the etchback process, thereby forming a third etch barrier film 130. The third etch barrier film 130 is patterned using a photolithography process in such a fashion that it is removed from the RAM cell region B.

The third etch barrier film 130 serves to prevent the logic circuit region A from being damaged by the etchant used during a removal of the third interlayer insulating film 230 from the RAM cell region B. In this regard, it is desirable to overlap the third etch barrier film 130 with the dummy electrodes 420b arranged adjacent to the logic circuit region A.

Figure 5D:
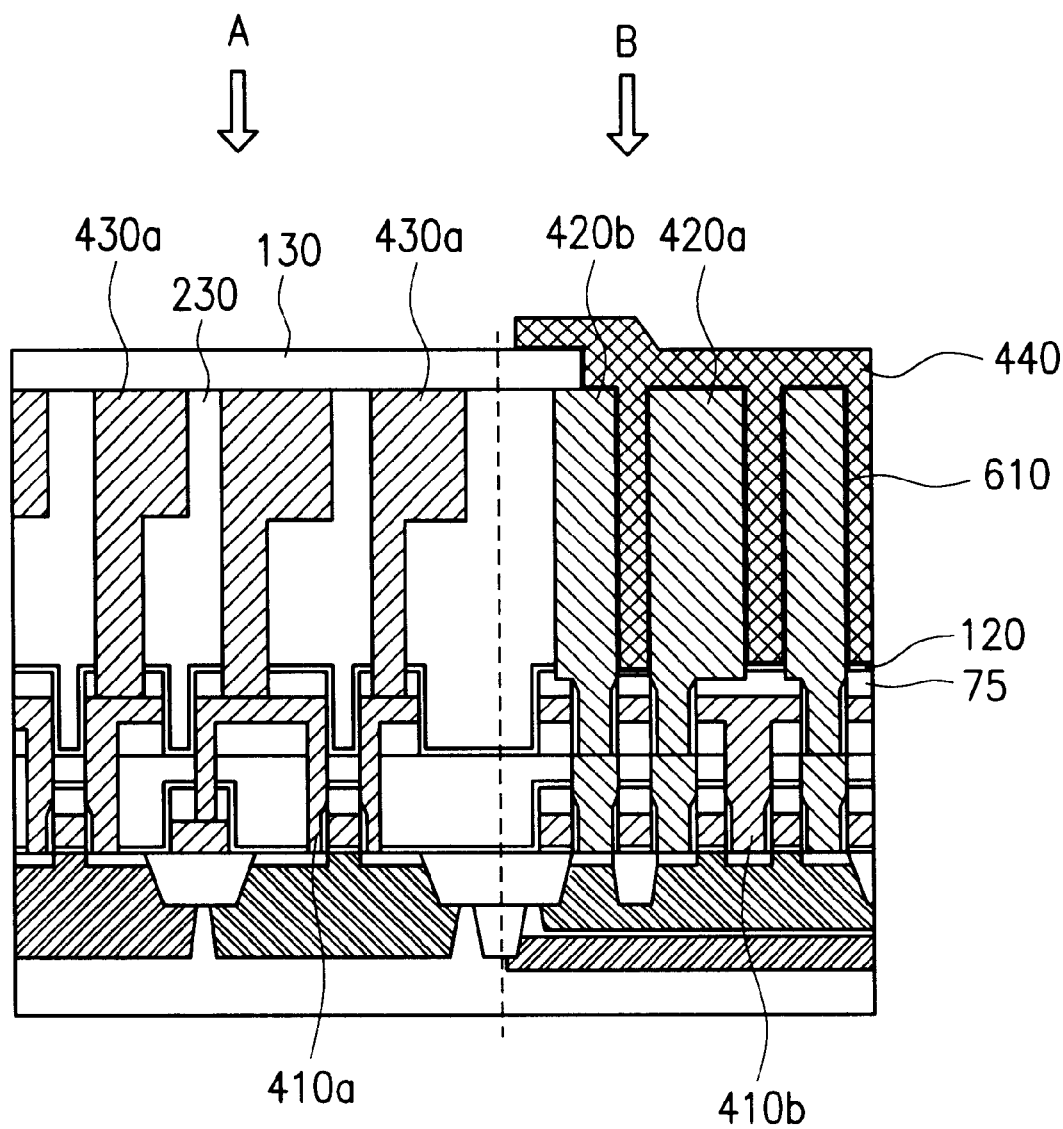

Referring to FIG. 5d, the third interlayer insulating film 230 exposed after the patterning step for the third etch barrier film 130 is then removed from the RAM cell region B.

Thereafter, a dielectric film 610 is formed by laminating a dielectric material over the entire upper surface of the resulting structure obtained after the processing step of FIG. 5d. A conductive material such as polysilicon is then formed over the dielectric film 610, thereby forming a fourth conductive layer 440.

The fourth conductive layer 440 is then removed from the logic circuit region A, thereby forming a plate electrode 440a. Thus, stacked capacitors are obtained.

Preferably, the charge storage electrode may be subjected to a surface treatment so that it has an hemi-spherical grain (HSG) structure at its surface, thereby achieving an increased capacitance of the capacitors, as in the first embodiment.

The subsequent processing steps of this embodiment are the same as those in the first embodiment. Accordingly, no description will be made for these processing steps.

Since the processing steps of forming and patterning the sacrificial film 510 are eliminated, this embodiment provides effects of simplifying the entire process and reducing the number of processing steps used, as compared to the first embodiment.

[Embodiment 2-1]

Figure 6:
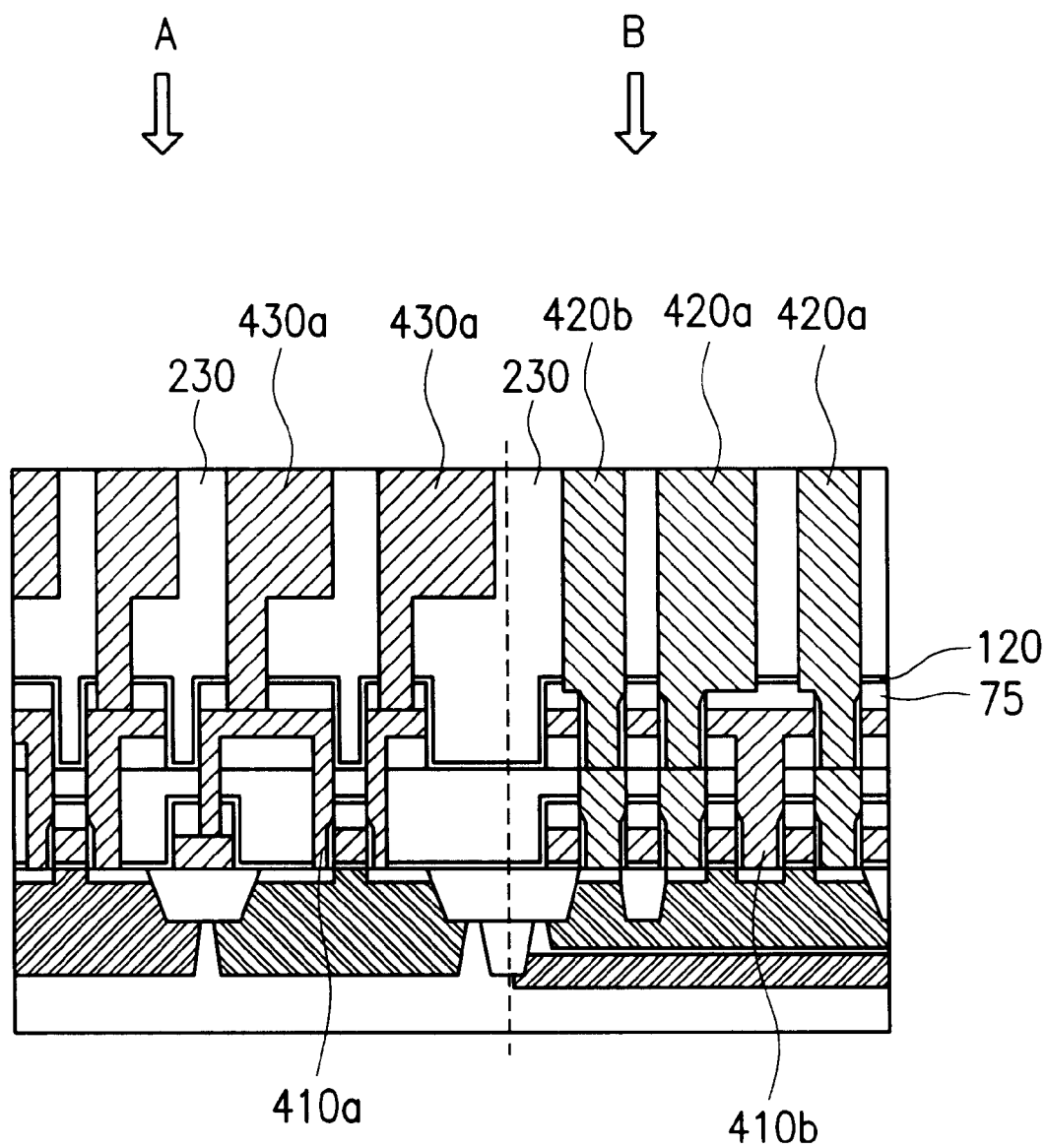
FIG. 6 is a cross-sectional view illustrating a method for fabricating a semiconductor device including stacked capacitors in accordance with a modified embodiment from the second embodiment of the present invention.

This embodiment is an embodiment modified from the second embodiment of the present invention. FIG. 6 is a cross-sectional view illustrating a method for fabricating a semiconductor device including stacked capacitors in accordance with a modified embodiment from the second embodiment of the present invention.

Referring to FIG. 6, the second conductive layer 420 formed at the processing step of FIG. 5a is partially removed using an etchback process in such a fashion that the upper surface of the third interlayer insulating film 230 is exposed, thereby forming charge storage electrodes 420a and dummy electrodes 420b.

Thereafter, the third interlayer insulating film 230, second etch barrier film 120, and second intermediate insulating film 75 are partially removed from the logic circuit region A, thereby forming contact holes. Subsequently, grooves are formed by partially removing a portion of the second conductive layer 420 arranged at a region formed with the contact holes to a desired depth.

A conductive material is then laminated over the entire upper surface of the resulting structure obtained after the formation of the grooves, thereby forming a third conductive layer 430. The third conductive layer 430 is partially removed in such a fashion that the upper surface of the third interlayer insulating film 230 is exposed, thereby forming second interconnection lines 430a.

The same subsequent processing steps as those of the second embodiment are then carried out. Accordingly, no description will be made for those subsequent processing steps.

Although this modified embodiment uses one additional etchback step, as compared to the second embodiment, it has an advantage in that only one etching step is required for the second conductive layer 420, as compared to the second embodiment in which it is necessary to conduct etchback steps of three times, that is, etchback steps for forming the contact holes, forming the grooves, and etching back the conductive layers 420 and 430.

[Embodiment 3]

Figure 7A:
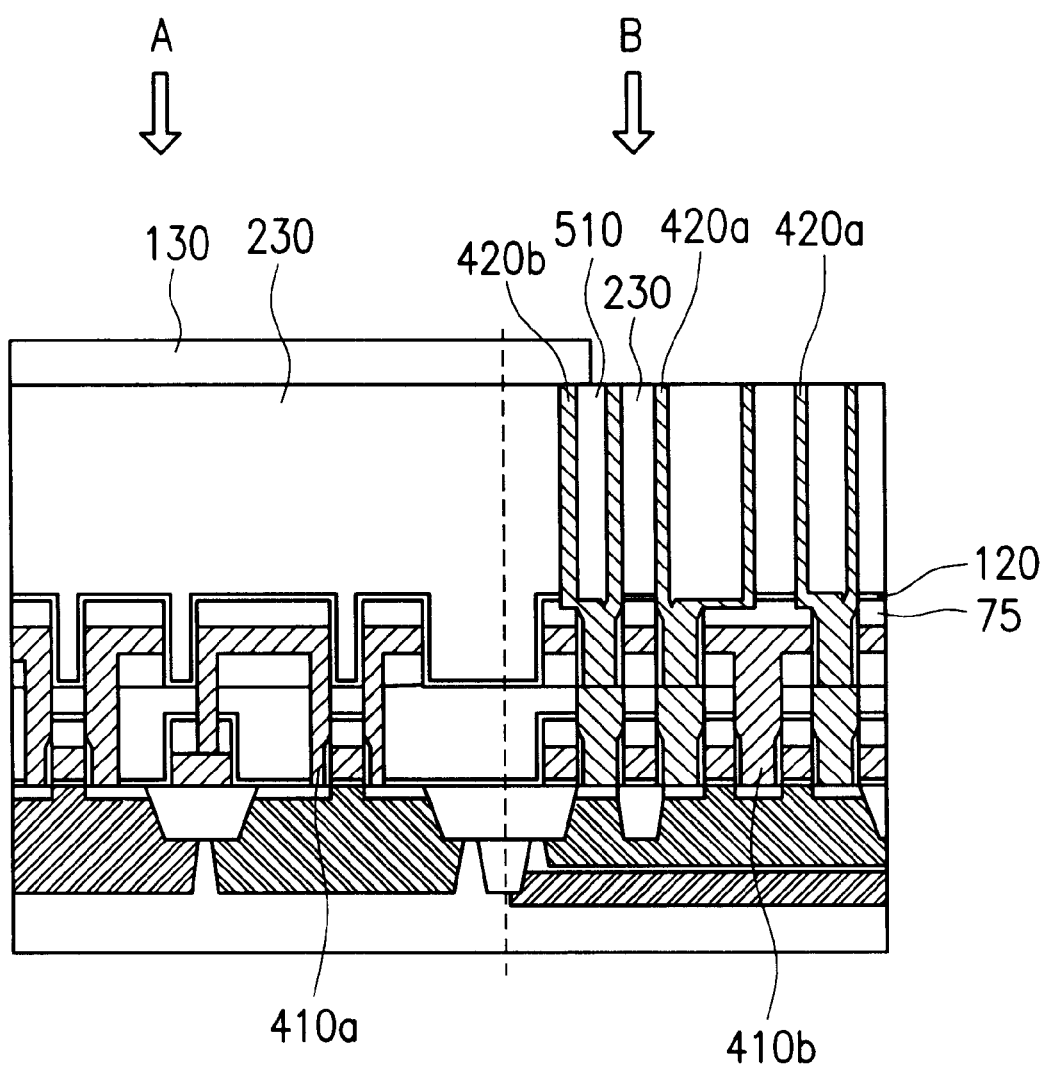
FIGS. 7a to 7c are cross-sectional views respectively illustrating sequential processing steps of a method for fabricating a semiconductor device including stacked capacitors in accordance with a third embodiment of the present invention.
Figure 7B:
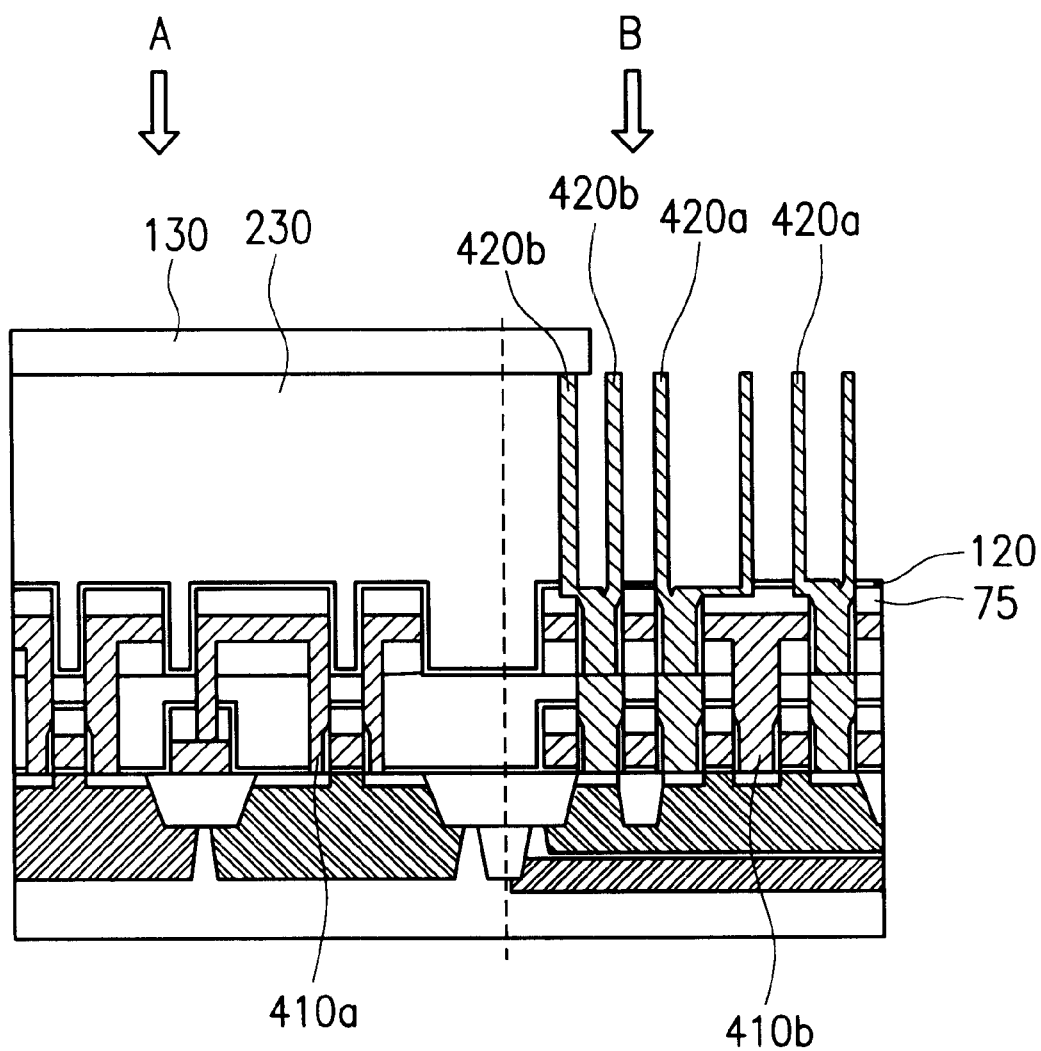
Figure 7C:
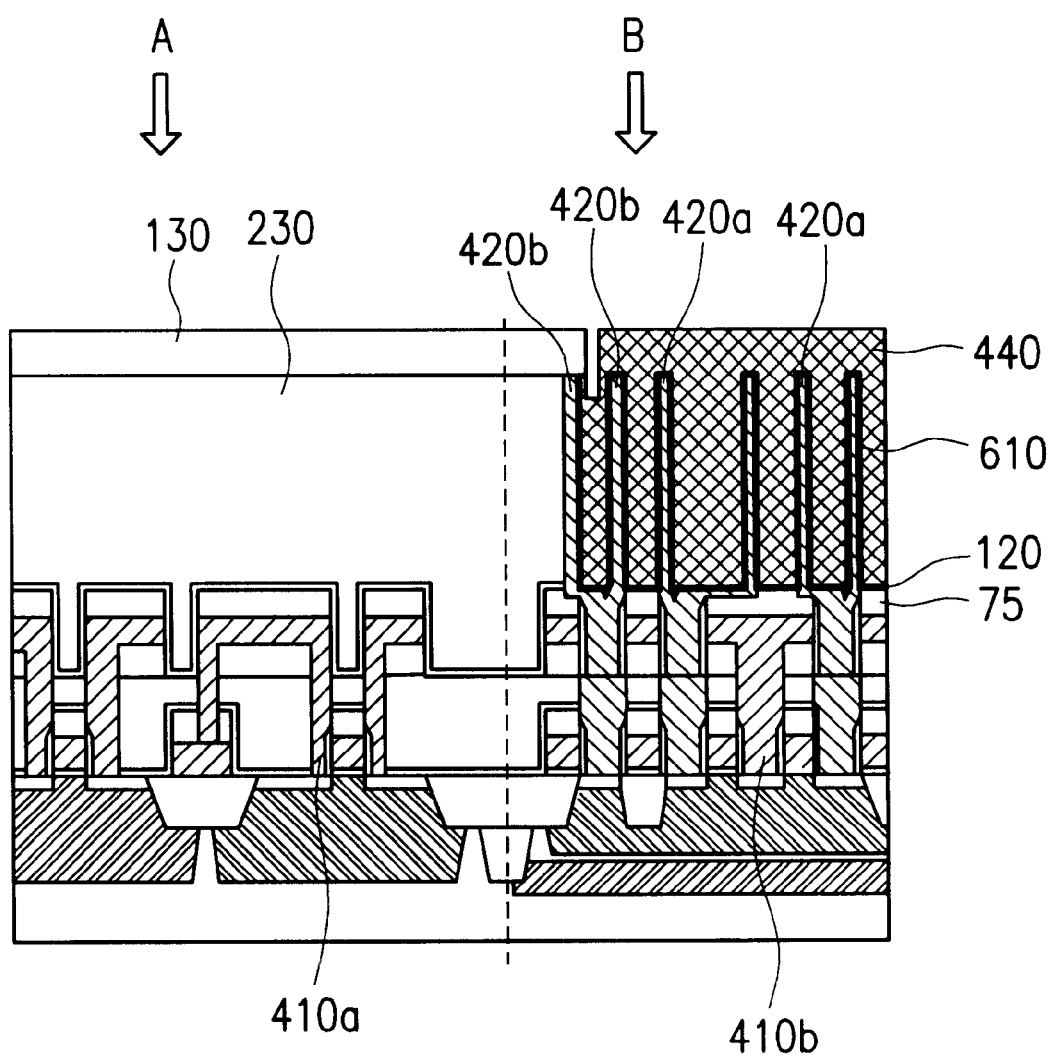

FIGS. 7a to 7c are cross-sectional views respectively illustrating sequential processing steps of a method for fabricating a semiconductor device including stacked capacitors in accordance with a third embodiment of the present invention.

The formation of the sacrificial film 510 in this embodiment is achieved using the same processing steps as those in the first embodiment of the present invention, that is, the processing steps of FIGS. 2a to 2e. Accordingly, the description of this embodiment will be made for processing steps following the formation of the sacrificial film 510.

Referring to FIG. 7a, the sacrificial film 510 and second conductive layer 420 are sequentially removed using an etchback process in such a fashion that the upper surface of the third interlayer insulating film 230 is exposed, in accordance with this method. Thus, the remaining second conductive layer 420 is formed into charge storage electrodes 420a and dummy electrodes 420b. At this time, both the third interlayer insulating film and the sacrificial film 510 are in an exposed state.

Thereafter, a nitride film or other appropriate material is laminated over the entire upper surface of the resulting structure obtained after the etchback step, thereby forming a third etch barrier film 130. This etch barrier film 130 is then patterned using a photolithography process to remove its portion arranged in the RAM cell region B.

As a result, respective portions of the sacrificial film 510 and third interlayer insulating film 230 arranged in the RAM cell region B are exposed. The third etch barrier film 130 serves to prevent the logic circuit region A from being damaged by the etchant used during a removal of the sacrificial film 510 and third interlayer insulating film 230 from the RAM cell region B. In this regard, it is desirable to overlap the third etch barrier film 130 with the dummy electrodes 420b arranged adjacent to the logic circuit region A.

Referring to FIG. 7b, the exposed sacrificial film 510 and third interlayer insulating film 230 are then removed using appropriate etchants, respectively. The etchants may be changed in accordance with respective materials of the sacrificial film 510 and third interlayer insulating film 230.

Referring to FIG. 7c, a dielectric film 610 is subsequently formed by laminating a dielectric material over the entire upper surface of the resulting structure obtained after the processing step of FIG. 7b. A conductive material such as polysilicon is then formed over the dielectric film 610, thereby forming a conductive layer. This conductive layer is then removed from the logic circuit region A, thereby forming a plate electrode 440a.

Thus, stacked capacitors are formed in the RAM cell region B without forming any step between the logic circuit region A and the RAM cell region B.

Preferably, the charge storage electrodes 420 may subjected to a surface treatment so that they have an hemi-spherical grain (HSG) structure at their surfaces, thereby achieving an increased capacitance of the capacitors.

Alternatively, the charge storage electrodes 420 may be formed in such a fashion that they completely fill the contact holes, as in the second embodiment.

In accordance with this embodiment, no step is formed between the RAM cell region B and the logic circuit region A even after subsequent processing steps according to any combination of the above mentioned embodiments are conducted. This is because, the step existing between the RAM cell region B and the logic circuit region A has been completely removed in a state in which the stacked capacitors are obtained.

As apparent from the above description, in accordance with the present invention, steps formed during the formation of capacitors are removed prior to subsequent processing steps for forming layers over those capacitors. Accordingly, it is possible to accurately pattern the layers formed after the formation of the capacitors. It is also possible to achieve a desired fineness of interconnection lines.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device including stacked capacitors on a semiconductor substrate having a logic circuit region formed with a logic circuit and a RAM cell region formed with a plurality of transistors, comprising the steps of:

forming a first etch barrier film and a first interlayer insulating film on the semiconductor substrate having the logic circuit and a plurality of transistors, in turn;

forming first contract holes respective exposing drain regions in the RAM cell region by etching the first interlayer insulating film and the first etch barrier film formed on the RAM cell region;

forming contact plugs and a dummy plug by filling up a conductive material into the first contact holes;

forming a second interlayer insulating film on the entire surface of the resulting structure;

forming second contact holes respective exposing a source region in the RAM cell region and an active region and a gate electrode in the logic circuit region by etching the second interlayer insulating film, the first interlayer insulating film and the first etch barrier film;

forming a first conductive layer on the second interlayer insulating film to fill the second contact holes;

forming an insulating film on the first conductive layer;

forming first interconnection lines and bit lines by patterning the insulating film and the first conductive layer;

forming a second etch barrier film on the entire surface of the resulting structure;

forming a third interlayer insulting film on the second etch barrier film;

forming third contact holes respective exposing the contact plugs and the dummy plug by etching the third interlayer insulating film and the second etch barrier film formed on the RAM cell region;

forming a second conductive layer on surface of the third contact holes and the third interlayer insulating film;

forming a sacrificial film on the second conductive layer to fill the third contact holes;

forming fourth contact holes respective exposing the first interconnection lines by etching the sacrificial film, the second conductive layer, the third interlayer insulating film, the second etch barrier film and the insulating layer formed on the logic circuit region;

forming grooves at the upper part of the fourth contact holes by etching the sacrificial film, the second conductive layer and the third interlayer insulating film formed on the logic circuit region;

forming a third conductive layer on the entire surface of the resulting structure to fill the fourth contact hole and the groove;

forming charge storage electrodes and a dummy electrode in the RAM cell region and a second interconnection line contact with the first interconnection line in the logic circuit region by etching the third conductive layer, the sacrificial film and the second conductive layer;

forming a third etch barrier film on entire surface of the resulting structure electrodes, and removing the portion of the third etch barrier film formed on the RAM cell region;

removing the portion of the sacrificial film formed on the RAM cell region to expose the charge storage electrode and the dummy electrode;

forming a dielectric layer and a fourth conductive layer on entire surface of the resulting structure, in turn; and forming a plate electrode comprising of the fourth conductive layer on the RAM cell region by etching the fourth conductive layer and the dielectric layer.

2. The method according to claim 1, further comprising the step of:

etching the sacrificial film layer to expose the second conductive layer, prior to the step of forming the fourth contact holes.

3. The method according to claim 1, further comprising the steps of:

etching the sacrificial film and the second conductive layer to expose the third interlayer insulating film prior to the step of forming the fourth contact holes.

4. A method for fabricating a semiconductor device including stacked capacitors on a semiconductor substrate having a logic circuit region formed with a logic circuit and a RAM cell region formed with a plurality of transistors, comprising the steps of:

forming a first etch barrier film and a first interlayer insulating film on the semiconductor substrate having the logic circuit and a plurality of transistors, in turn;

forming first contact holes respective exposing drain regions in the RAM cell region by etching the first interlayer insulating film and the first etch barrier film formed on the RAM cell region;

forming contact plugs and a dummy plug by filling up a conductive material into the first contact holes;

forming a second interlayer insulating film on the entire surface of the resulting structure;

forming second contact holes respective exposing a source regions in the RAM cell region and an active region and a gate electrode in the logic circuit region by etching the second interlayer insulating film, the first interlayer insulating film and the first etch barrier film;

forming a first conductive layer on the second interlayer insulating film to fill the second contact holes;

forming an insulating film on the first conductive layer;

forming first interconnection lines and bit lines by patterning the insulating film and the first conductive layer;

forming a second etch barrier film on the entire surface of the resulting structure;

forming a third interlayer insulating film on the second etch barrier film;

forming third contact holes respective exposing the contact plug and the dummy plug by etching the third interlayer insulating film and the second etch barrier film formed on the RAM cell region;

forming a second conductive layer on the entire surface of the resulting structure to fill the third contact holes;

forming fourth contact holes respective exposing the first interconnection lines by etching the second conductive layer, the third interlayer insulating film, the second etch barrier film and the insulating layer formed on the logic circuit region;

forming grooves at the upper part of the fourth contact holes by etching the second conductive layer and the third interlayer insulating film formed on the logic circuit region;

forming a third conductive layer on the entire surface of the resulting structure to fill the fourth contact hole and the groove;

forming charge storage electrodes and a dummy electrode in RAM cell region and a second interconnection line contact with the first interconnection line in the logic circuit region by removing the third conductive layer and the second conductive layer to the surface of the third interlayer insulating film;

forming a third etch barrier film on the entire surface of the resulting structure;

removing the portion of the third etch barrier film formed on the RAM cell region;

removing the third interlayer insulating film formed on the RAM cell region;

forming a dielectric layer and a fourth conductive layer on entire surface of the resulting structure, in turn; and forming a plate electrode comprising the fourth conductive layer on the RAM cell region by etching the fourth conductive layer and the dielectric layer.

5. The method according to claim 4, further comprising the steps of:

etching the second conductive layer to expose the third interlayer insulating film, prior to the step of forming the fourth contact holes.

6. A method for fabricating a semiconductor device including stacked capacitors on a semiconductor substrate having a logic circuit region formed with a logic circuit and a RAM cell region formed with a plurality of transistors, comprising the steps of:

forming a first etch barrier film and a first interlayer insulating film on the semiconductor substrate having the logic circuit and a plurality of transistors, in turn;

forming first contact holes respective exposing drain regions in the RAM cell region by etching the first interlayer insulating film and the first etch barrier film formed on the RAM cell region;

forming contact plugs and a dummy plug by filling up a conductive material into the first contact holes;

forming a second interlayer insulating film on the entire surface of the resulting structure;

forming second contact holes respective exposing a source region in the RAM cell region and an active region and a gate electrode in the logic circuit region by etching the second interlayer insulating film, the first interlayer insulating film and the first etch barrier film;

forming a first conductive layer on the second interlayer insulating film to fill the second contact holes;

forming an insulating film on the first conductive layer;

forming first interconnection lines and bit lines by patterning the insulating film and the first conductive layer;

forming a second etch barrier film on the entire surface of the resulting structure;

forming a third interlayer insulating film on the second etch barrier film;

forming third contact holes respective exposing the contact plugs and the dummy plug by etching the third interlayer insulating film and the second etch barrier film formed on the RAM cell region;

forming a second conductive layer on surface of the third contact holes and the third interlayer insulating film;

forming a sacrificial film on the second conductive layer to fill the third contact holes;

forming charge storage electrodes and a dummy electrode comprising of the second conductive layer in the RAM cell region by etching the sacrificial layer and the second conductive layer;

forming a third etch barrier film on the entire surface of the resulting structure;

removing the portion of the third etch barrier film formed on the RAM cell region;

removing the sacrificial film and the third interlayer insulating film formed on the RAM cell region;

forming a dielectric layer and a fourth conductive layer on entire surface of the resulting structure, in turn; and forming a plate electrode comprising of the fourth conductive layer on the RAM cell region by etching the fourth conductive layer and the dielectric layer.

7. The method according to claim 1, wherein the third interlayer insulating film has a thickness corresponding to the height of the stacked capacitors to be formed.

8. The method according to claim 1, further comprising the step of:

treating the charge storage electrodes in such a fashion that the charge storage electrodes have a hemispherical grain structure at upper surfaces thereof, prior to the step of forming the dielectric film.

9. The method according to claim 1, wherein the step of removing the third etch barrier film is carried out in such a fashion that the portion of the third etch barrier film formed on the dummy electrode is left.

10. The method according to claim 1, wherein the interlayer insulating films is made of an oxide film, and the etch barrier film is made of a nitride film.

11. The method according to claim 1, wherein the sacrificial film is made of the same material as the third interlayer insulating film.

12. The method according to claim 1, wherein the interlayer insulating film and the interconnection line have a multi-layer structure, corresponding to the height of the stacked capacitors, in the logic circuit region.

* * * * *